(12) United States Patent
Forbes

(10) Patent No.: US 7,501,329 B2
(45) Date of Patent: *Mar. 10, 2009

(54) WAFER GETTERING USING RELAXED SILICON GERMANIUM EPITAXIAL PROXIMITY LAYERS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/443,339

(22) Filed: May 21, 2003

(65) Prior Publication Data

US 2004/0232422 A1 Nov. 25, 2004

(51) Int. Cl.
*H01L 21/322* (2006.01)
(52) U.S. Cl. ............... 438/471; 438/166; 438/473; 438/933; 257/E21.135
(58) Field of Classification Search .......... 438/166, 438/471, 473, 933
See application file for complete search history.

(56) References Cited

U.S. PATENT DOCUMENTS

| | | | |
|---|---|---|---|
| 4,053,925 A | 10/1977 | Burr et al. | |
| 4,241,359 A | 12/1980 | Izumi et al. | 257/386 |
| 4,314,595 A | 2/1982 | Yamamoto et al. | 148/1.5 |
| 4,589,928 A | 5/1986 | Dalton et al. | 438/142 |
| 4,631,234 A | 12/1986 | Larrabee | |
| 4,717,681 A | 1/1988 | Curran | 438/314 |
| 4,962,051 A * | 10/1990 | Liaw | 438/474 |
| 5,098,852 A | 3/1992 | Niki et al. | |
| 5,343,064 A | 8/1994 | Spangler et al. | |
| 5,426,061 A | 6/1995 | Sopori | 438/475 |
| 5,426,069 A | 6/1995 | Selvakumar et al. | |
| 5,443,661 A | 8/1995 | Oguro et al. | 148/33.5 |
| 5,461,243 A | 10/1995 | Ek et al. | 257/190 |

(Continued)

FOREIGN PATENT DOCUMENTS

EP 434984 9/1991

(Continued)

OTHER PUBLICATIONS

"Cornell Demonstrates a Universal Substrate", *Compound Semiconductor*, 3(2), (Mar./Apr. 1997),27-29.

(Continued)

*Primary Examiner*—Wai-Sing Louie
(74) *Attorney, Agent, or Firm*—Schwegman, Lundberg & Woessner, P.A.

(57) ABSTRACT

One aspect of this disclosure relates to a method for creating proximity gettering sites in a semiconductor wafer. In various embodiments of this method, a relaxed silicon germanium region is formed to be proximate to a device region on the semiconductor wafer. The relaxed silicon germanium region generates defects to getter impurities from the device region. In various embodiments, an ultra high vacuum chemical vapor deposition (UHV CVD) process is performed to epitaxially form the relaxed silicon germanium gettering region. In various embodiments, forming the relaxed silicon germanium gettering region includes implanting germanium ions into a silicon substrate with a desired dose and energy to form a silicon region containing germanium ions and heat treating the substrate to regrow a crystalline silicon layer over a resulting silicon germanium layer using a solid phase epitaxial (SPE) process. Other aspects are provided herein.

27 Claims, 9 Drawing Sheets

U.S. PATENT DOCUMENTS

| | | | |
|---|---|---|---|
| 5,482,869 A | 1/1996 | Kohyama | |
| 5,646,053 A | 7/1997 | Schepis et al. | 438/402 |
| 5,661,044 A | 8/1997 | Holland et al. | 438/766 |
| 5,679,475 A | 10/1997 | Yamagata et al. | |
| 5,691,230 A | 11/1997 | Forbes | 437/62 |
| 5,698,869 A | 12/1997 | Yoshimi et al. | |
| 5,723,896 A | 3/1998 | Yee et al. | |
| 5,735,949 A | 4/1998 | Mantl et al. | |
| 5,759,898 A | 6/1998 | Ek et al. | 438/291 |
| 5,773,152 A | 6/1998 | Okonogi | 428/446 |
| 5,789,859 A | 8/1998 | Watkins et al. | 313/495 |
| 5,818,761 A | 10/1998 | Onakado et al. | |
| 5,840,590 A | 11/1998 | Myers, Jr. et al. | 438/471 |
| 5,858,819 A | 1/1999 | Miyasaka | |
| 5,879,996 A | 3/1999 | Forbes | 438/289 |
| 5,900,652 A | 5/1999 | Battaglia et al. | |
| 5,963,817 A | 10/1999 | Chu et al. | 438/410 |
| 5,997,378 A | 12/1999 | Dynka et al. | 445/25 |
| 6,001,711 A | 12/1999 | Hashimoto | 438/473 |
| 6,022,793 A | 2/2000 | Wijaranakula et al. | 438/473 |
| 6,054,808 A | 4/2000 | Watkins et al. | 313/495 |
| 6,083,324 A | 7/2000 | Henley et al. | 148/33.2 |
| 6,093,623 A | 7/2000 | Forbes | 438/455 |
| 6,093,624 A | 7/2000 | Letavic et al. | 438/462 |
| 6,127,777 A | 10/2000 | Watkins et al. | 313/554 |
| 6,172,456 B1 | 1/2001 | Cathey et al. | 313/495 |
| 6,174,784 B1 | 1/2001 | Forbes | 438/405 |
| 6,180,487 B1 | 1/2001 | Lin | |
| 6,185,144 B1 | 2/2001 | Suzuki | |
| 6,204,145 B1 | 3/2001 | Noble | 438/412 |
| 6,228,694 B1 | 5/2001 | Doyle et al. | 438/199 |
| 6,243,299 B1 | 6/2001 | Rinerson et al. | |
| 6,251,751 B1 | 6/2001 | Chu et al. | 438/439 |
| 6,274,460 B1 | 8/2001 | Delgado et al. | 438/476 |
| 6,309,950 B1 | 10/2001 | Forbes | 438/455 |
| 6,315,826 B1 | 11/2001 | Muramatsu | 117/95 |
| 6,328,796 B1 | 12/2001 | Kub et al. | |
| 6,337,260 B1 * | 1/2002 | Ishida | 438/471 |
| 6,338,805 B1 | 1/2002 | Anderson | 216/89 |
| 6,339,011 B1 | 1/2002 | Gonzalez et al. | 438/473 |
| 6,368,938 B1 | 4/2002 | Usenko | 438/407 |
| 6,376,336 B1 | 4/2002 | Buynoski | 438/476 |
| 6,377,070 B1 | 4/2002 | Forbes | 326/41 |
| 6,391,738 B2 | 5/2002 | Moore | 438/402 |
| 6,424,001 B1 | 7/2002 | Forbes et al. | 257/315 |
| 6,444,534 B1 | 9/2002 | Maszara | 438/311 |
| 6,448,157 B1 | 9/2002 | Okonogi et al. | |
| 6,448,601 B1 | 9/2002 | Forbes et al. | 257/302 |
| 6,451,672 B1 | 9/2002 | Caruso et al. | |
| 6,455,397 B1 | 9/2002 | Belford | |
| 6,461,933 B2 | 10/2002 | Houston | 438/423 |
| 6,465,873 B1 | 10/2002 | Gonzalez | |
| 6,478,883 B1 | 11/2002 | Tamatsuka et al. | 148/33.2 |
| 6,496,034 B2 | 12/2002 | Forbes et al. | 326/41 |
| 6,514,836 B2 | 2/2003 | Belford | |
| 6,515,335 B1 * | 2/2003 | Christiansen et al. | 257/347 |
| 6,531,727 B2 | 3/2003 | Forbes et al. | 257/302 |
| 6,538,330 B1 | 3/2003 | Forbes | 257/777 |
| 6,541,356 B2 | 4/2003 | Fogel et al. | 438/480 |
| 6,559,491 B2 | 5/2003 | Forbes et al. | 257/296 |
| 6,566,682 B2 | 5/2003 | Forbes | 257/51 |
| 6,582,512 B2 | 6/2003 | Geusic et al. | 117/3 |
| 6,583,437 B2 | 6/2003 | Mizuno et al. | 257/19 |
| 6,593,625 B2 | 7/2003 | Mooney et al. | 257/347 |
| 6,597,203 B2 | 7/2003 | Forbes | 326/98 |
| 6,620,683 B1 * | 9/2003 | Lin et al. | 438/257 |
| 6,642,123 B2 | 11/2003 | Mun et al. | |
| 6,649,476 B2 | 11/2003 | Forbes | 438/268 |
| 6,656,822 B2 | 12/2003 | Doyle et al. | |
| 6,689,671 B1 | 2/2004 | Yu et al. | |
| 6,703,293 B2 * | 3/2004 | Tweet et al. | 438/518 |
| 6,703,648 B1 | 3/2004 | Xiang et al. | 257/192 |
| 6,713,326 B2 | 3/2004 | Cheng et al. | |
| 6,717,216 B1 | 4/2004 | Doris et al. | |
| 6,740,913 B2 | 5/2004 | Doyle et al. | |
| 6,809,016 B1 | 10/2004 | Xiang | |
| 6,825,102 B1 | 11/2004 | Bedell et al. | |
| 6,855,649 B2 | 2/2005 | Christiansen et al. | |
| 6,900,094 B2 | 5/2005 | Hammond et al. | |
| 6,929,984 B2 | 8/2005 | Forbes et al. | |
| 6,963,078 B2 | 11/2005 | Chu | |
| 6,987,037 B2 | 1/2006 | Forbes | |
| 7,153,753 B2 | 12/2006 | Forbes | |
| 7,262,428 B2 | 8/2007 | Forbes | |
| 7,326,597 B2 | 2/2008 | Forbes et al. | |
| 7,368,790 B2 | 5/2008 | Forbes | |
| 7,394,111 B2 | 7/2008 | Forbes | |
| 2001/0052621 A1 | 12/2001 | Beaman | |
| 2002/0001965 A1 | 1/2002 | Forbes | 438/734 |
| 2002/0070421 A1 | 6/2002 | Ashburn | 257/510 |
| 2002/0125471 A1 | 9/2002 | Fitzgerald et al. | |
| 2002/0175330 A1 | 11/2002 | Geusic et al. | |
| 2002/0185686 A1 | 12/2002 | Christiansen et al. | 257/347 |
| 2003/0013323 A1 | 1/2003 | Hammond et al. | 438/981 |
| 2003/0027406 A1 | 2/2003 | Malone | 438/471 |
| 2003/0131782 A1 | 7/2003 | Geusic et al. | |
| 2003/0201468 A1 | 10/2003 | Christiansen et al. | 257/200 |
| 2003/0218189 A1 * | 11/2003 | Christiansen et al. | 257/200 |
| 2003/0227072 A1 | 12/2003 | Forbes | 257/616 |
| 2004/0005740 A1 | 1/2004 | Lochtefeld et al. | |
| 2004/0048450 A1 | 3/2004 | Tweet et al. | |
| 2004/0135138 A1 | 7/2004 | Hsu et al. | |
| 2004/0171196 A1 | 9/2004 | Walitzki | |
| 2004/0173798 A1 | 9/2004 | Forbes | |
| 2004/0217352 A1 | 11/2004 | Forbes | |
| 2004/0217391 A1 | 11/2004 | Forbes | |
| 2004/0224480 A1 | 11/2004 | Forbes | |
| 2004/0232487 A1 | 11/2004 | Forbes | |
| 2004/0232488 A1 | 11/2004 | Forbes | |
| 2004/0235264 A1 * | 11/2004 | Forbes | 438/429 |
| 2005/0017273 A1 | 1/2005 | Forbes et al. | |
| 2005/0020094 A1 | 1/2005 | Forbes et al. | |
| 2005/0023529 A1 | 2/2005 | Forbes | |
| 2005/0023612 A1 | 2/2005 | Forbes | |
| 2005/0023616 A1 | 2/2005 | Forbes | |
| 2005/0029619 A1 | 2/2005 | Forbes | |
| 2005/0029683 A1 | 2/2005 | Forbes et al. | |
| 2005/0032296 A1 | 2/2005 | Forbes | |
| 2005/0087842 A1 | 4/2005 | Forbes | |
| 2005/0250274 A1 | 11/2005 | Forbes et al. | |
| 2005/0285139 A1 | 12/2005 | Forbes | |
| 2006/0001094 A1 | 1/2006 | Forbes | |
| 2006/0011982 A1 | 1/2006 | Forbes | |
| 2006/0258063 A1 | 11/2006 | Forbes | |
| 2006/0258123 A1 | 11/2006 | Forbes | |
| 2006/0267152 A1 | 11/2006 | Forbes | |
| 2007/0075401 A1 | 4/2007 | Forbes et al. | |
| 2007/0080335 A1 | 4/2007 | Forbes et al. | |
| 2008/0078988 A1 | 4/2008 | Forbes | |

FOREIGN PATENT DOCUMENTS

| | | |
|---|---|---|
| JP | 54-152464 A | 11/1979 |
| JP | 54-155770 A | 12/1979 |
| JP | 04-304653 | 10/1992 |
| WO | WO02097982 | 12/2002 |

OTHER PUBLICATIONS

Abe, T, "Silicon Wafer-Bonding Process Technology for SOI Structures", *Extended Abstracts of the 22nd (1990 International) Conference on Solid State Devices and Materials*, (1990),853-856.

Auberton-Herve, A J., "SOI: Materials to Systems", *International Electron Devices Meeting. Technical Digest*, (1996),3-10.

Autumn, Kellar, et al., "Adhesive force of a single gecko foot-hair", *Nature*, 405(6787), (Jun. 2000),681-685.

Autumn, Kellar, et al., "Evidence for van der Waals adhesion in gecko satae.", *Proceedings of the National Academy of Science U S A.*; 99(19), (Sep. 17, 2002),12252-6.

Baginski, T. A., "Back-side germanium ion implantation gettering of silicon", *Journal of the Electrochemical Society*, 135(7), Dept of Electrical Engineering, Auburn Univ, AL,(Jul. 1988), 1842-3.

Belford, Rona E., "Performance-Augmented CMOS Using Back-End Uniaxial Strain", *IEEE Device Research Conference*, (2002), 41-42.

Berti, M., "Composition and Structure of Si-Ge Layers Produces by Ion Implantation and Laser Melting", *Journal of Materials Research*, 6(10), (Oct. 1991),2120-2126.

Berti, M., "Laser Induced Epitaxial Regrowth of Si[-xGex/Si Layers Produced by Ge Ion Implantation", *Applied Surface Science*, 43, (1989),158-164.

Bialas, F., et al., "Intrinsic Gettering of 300 mm CZ Wafers", *Microelectronic Engineering*, 56(1-2), (May 2001), 157-63.

Biever, Celeste, "Secret of 'strained silicon' revealed: behind closed doors, Intel has perfected a novel way to improve chip performance.", *New Scientist*, 180(i2426-2428), (Dec. 20, 2003),27.

Binns, M. J., et al., "The Realization of Uniform and Reliable Intrinsic Gettering in 200mm P- & P/P Wafers for a Low Thermal Budget 0.18 mu m Advanced CMOS logic Process", *Diffusion and Defect Data Pt.B: Solid State Phenomena*, 82-84, (2001),387-92.

Bronner, G. B., et al., "Physical Modeling of Backside Gettering", *Impurity Diffusion and Gettering in Silicon Symposium*, Sponsor: Mater. Res. Soc, Nov 1984, Boston, MA, (1985), 27-30.

Brown, Chappell, "Bonding twist hints at universal substrate", *EE Times*, (1997), 2pages.

Bruel, M, "Smart-Cut: A new silicon on insulator material technology based on hydrogen implantation and wafer bonding", *Japanese Journal of Applied Physics*, (1997), Abstract.

Chen, Xiangdong, et al., "Vertical P-MOSFETs with heterojunction between source/drain and channel", *IEEE Device Research Conference*, (2000), 25-26.

Chilton, B T., et al., "Solid Phase epitaxial regrowth of strained Si(1-x)Ge(x)/Si strained layer structures amorphized by ion implantation", *Applied Physics Letters*, 54(1), (Jan. 2, 1989), 42-44.

Choe, K. S., et al., "Minority-Carrier Lifetime Optimization in Silicon MOS Devices by Intrinsic Gettering", *Journal of Crystal Growth*, 218(2-4), (Sep. 2000), 239-44.

Clark, Don, et al., "Intel unveils tiny new transistors: Process handles circuits 1/2000th the width of a human hair", *The Wall Street Journal*, (Aug. 13, 2002), 3 pages.

Clifton, P A., et al., "A process for strained silicon n-channel HMOSFETs", *ESSDERC'96. Proceedings of the 26th European Solid State Device Research Conference*, (Sep. 1996),519-22.

Dubbelday, W B., et al., "Oscillatory strain relaxation in solid phase epitaxially regrown silicon on sapphire", *Proceedings of the First International Workshop Lattice Mismatched Thin Films*, (Sep. 13-15, 1998),13-17.

Fischetti, M V., et al., "Band structure, deformation potentials, and carrier mobility in strained Si, Ge, and SiGe alloys", *Journal of Applied Physics*, 80(4), (Aug. 15, 1996),2234-2252.

Fournel, F, et al., "Ultra High Precision Of The Tilt/Twist Misorientation Angles In Silicon/Silicon Direct Wafer Bonding", *Abstract—Electronic Materials Conference*, (Jun. 2002),9.

Garcia, G A., et al., "High-quality CMOS in thin (100 nm) silicon on sapphire", *IEEE Electron Device Letters*, 9(1), (Jan. 1988),32-34.

Godbole, H., et al., "An Investigation of Bulk Stacking Faults in Silicon Using Photocapacitance Transient Spectroscophy", *Materials Letters*, 8(6-7), Dept of Electr & Comput Engr, Oregon State Univ, Corvallis OR,(Jul. 1989),201-3.

Gong, S. S., et al., "Implantation Gettering in Silicon", *Solid-State Electronics*, 30(2), (Feb. 1987),209-11.

Graf, D., et al., "300 mm epi pp- wafer: is there sufficient gettering?", *High Purity Silicon VI. Proceedings of the Sixth International Symposium (Electrochemical Society Proceedings* vol. 2000-17) (SPIE vol. 4218), (2000),319-30.

Haddad, H., et al., "Carbon Doping Effects on Hot Electron Trapping", *28th Annual Proceedings. Reliability Physics 1990*, (Mar. 1990), 288-9.

Haddad, H., et al., "Electrical Activity of Bulk Stacking Faults in Silicon", *Materials Letters*, 7(3), Hewlett-Packard Northwest Integrated Circuits Div, Corvallis OR,(Sep. 1988),99-101.

Harendt, Christine, "Silicon on Insulator Material by Wafer Bonding", *Journal of Electronic Materials*, 20(3), (Mar. 1991),267-77.

Iyer, S S., "Separation by Plasma Implantation of Oxygen (SPIMOX) operational phase space", *IEEE trans. on Plasma Science*, 25, (1997), 1128-1135.

Kalavade, Pranav, et al., "a novel sub-10 nm transistor", *58th DRC. Device Research Conference. Conference Digest*, (Jun. 19-21, 2000),71-72.

Kang, J. S., et al., "Gettering in Silicon", *Journal of Applied Physics*, 65(8), Center for Solid State Electron Res. Arizona State Univ., Tempe, AZ,(Apr. 15, 1989),2974-85.

Kostrzewa, M, et al., "Testing the Feasibility of strain relaxed InAsP and InGaAs complaint substrates", *EMC 2003 International Conference Indium Phosphide and Related Materials. Conference Proceedings*, Other authors: G. Grenet et al,(Jun. 2003),8-9.

Kung, C. Y., et al., "The effect of carbon on oxygen precipitation in high carbon CZ silicon crystals", *Materials Research Bulletin*, 18(12), Silicon Materials Div., Fairchild Camera & Instrument Corp, Healdsburg, CA, (Dec. 1983),1437-41.

Lasky, J. B., "Wafer Bonding for Silicon-on-Insulator Technologies", *Applied Physics Letters*, 48(1), (Jan. 6, 1986),78-80.

Li, Y. X., et al., "New intrinsic gettering process in Czochralski-silicon wafer", *6th International Conference on Solid-State and Integrated Circuit Technology, Proceedings*, 1(1), (2001),277-9.

Loo, Y L., et al., "Contact Printing With Nanometer Resolution", *Device Research Conference*, (Jun. 2002), 149-150.

Lu, D,, "Bonding Silicon Wafers by Use of Electrostatic Fields Followed by Rapid Thermal Heating", *Materials Letters*, 4(11), (Oct. 1986),461-464.

Mizuno, T, et al., "Advanced SOI-MOSFETs with Strained-Si Channel for High Speed CMOS Electron/Hole Mobility Enhancement", *2000 Symposium on VLSI Technology, Digest of Technical Papers*, (2000),210-211.

Moran, Peter, "Strain Relaxation in Wafer-Bonded SiGe/Si Heterostructures Due to Viscous Flow of an Underlying Borosilicate Glass", *Electronic Materials Conference*, Santa Barbara, Jun. 2002, Abstract,(Jun. 2002),pp. 8-9.

Mumola, P. B., et al., "Recent advances in thinning of bonded SOI wafers by plasma assisted chemical etching", *Proceedings of the Third International Symposium on Semiconductor Wafer Bonding: Physics and Applications*, (1995),28-32.

Nayak, D.K., "High Performance GeSi quantum-well PMOS on SIMOX", *International Electron Devices Meeting 1992. Technical Digest*, (1992),777-80.

Nichols, F A., "Surface-(inteface) and volume-diffusion contributions to morphological changes driven by capillarity", *Transactions of the American Institute of Mining, Metallurgical and Petroleum Engineers*, 233(10), (1965),1840-8.

O'Neill, A G., et al., "High speed deep sub-micron MOSFET using high mobility strained silicon channel", *ESSDERC '95. Proceedings of the 25th European Solid State Device Research Conference*, (Sep. 1995), 109-12.

Omi, Hiroo, et al., "Semiconductor Surface with Strain Control", http://www.brl.ntt.co.jp/J/kouhou/katsudou/report00/E/report04—e.html.

Or, B S., et al., "Annealing effects of carbon in n-channel LDD MOSFETs", *IEEE Electron Device Letters*, 12(11), Dept of Electrical & Computing Engr, Oregon State Univ, Corvalis OR,(Nov. 1991),596-8.

Ouyang, Q, et al., "Bandgap Engineering in Deep Submicron Vertical pMOSFETs", *IEEE 58th DRC. Device Research Conference. Conference Digest*, (2000), 27-28.

Paine, D. C., "The Growth of Strained Si]-xGex Alloys on (100) Silicon Using Solid Phase Epitaxy", *Journal of Materials Research*, 5(5), (May 1990), 1023-1031.

People, R., "Calculation of critical layer thickness versus lattice mismatch for GexSi1-x/Si strained-layer heterostructures", *Applied Physics Letters*, 47(3), (Aug. 1, 1985),322-4.

Rim, Kern, et al., "Fabrication and analysis of deep submicron strained-Si n-MOSFET's", *IEEE Transactions on Electron Devices*, 47(7), (Jul. 2000), 1406-1415.

Rim, Kern, et al., "Strained Si NMOSFETs for High Performance CMOS Technology", *2001 Symposium on VLSI Technology. Digest of Technical Papers*, (2001),59-60.

Rim, Kern, et al., "Transconductance enhancement in deep submicron strained Si n-MOSFETs", *International Electron Devices Meeting 1998. Technical Digest*, (1998),707-710.

Rubin, L, et al., "Effective gettering of oxygen by oxygen by high dose, high energy boron buried layers", *1998 International Conference on Ion Implantation Technology. Proceedings*, 2(2), (1998), 1010-13.

Sato, Tsutomu, "A New Substrate Engineering for the Formation of Empty Space in Silicon (ESS) Induced by Silicon Surface Migration", *IEDM Digest, paper 20.6.1*, (1999),20.6.1-20.6.4.

Sato, T, "Trench transformation technology using hydrogen annealing for realizing highly reliable device structure with thin dielectric films", *1998 Symposium on VLSI Technology Digest of Technical Papers*, (1998),206-7.

Sugiyama, N, et al., "Formation of strained-silicon layer on thin relaxed-SiGe/SiO/sub 2//Si structure using SIMOX technology", *Thin Solid Films*, 369(1-2), (Jul. 2000), 199-202.

Takagi, Shin-Ichi, "Strained-Si- and SiGe-On-Insulator (Strained-SOI and SGOI) MOSFETs for High Performance/Low Power CMOS Application", *IEEE Device Research Conference, 2002. 60th DRC. Conference Digest*, (2002),37-40.

Tan, T. Y., et al., "Intrinsic gettering by oxide precipitate induced dislocations in Czochralski Si", *Applied Physics Letters*, 30(4), IBM System Products Div., Essex Junction, VT,(Feb. 15, 1977),175-6.

Verdonckt-Vandebroek,, Sophie, et al., "SiGe-Channel Heterjunction p-MOSFET's", *IEEE Transactions on Electron Devices*, 41(1), (Jan. 1994),90-101.

Welser, J, et al., "Strain dependence of the performance enhancement in strained-Si n-MOSFETs", *IEEE International Electron Devices Meeting 1994. Technical Digest*, (Dec. 11-14, 1994),373-376.

Whitwer, F. D., et al., "DLTS characterization of precipitation induced microdefects", *Materials Issues in Silicon Integrated Circuit Processing Symposium*, (Apr. 1986),53-57.

Wijaranakula, W., et al., "Effect of Pre- and Postepitaxial Deposition Annealing on Oxygen Precipitation in Silicon", *Journal of Materials Research*, 1(5), Dept of Electr & Comput Eng, Oregon State Univ, Corvallis, OR, (Sep.-Oct. 1986),698-704.

Wijaranakula, W., et al., "Effect of preanneal heat treatment on oxygen precipitation in epitaxial silicon", *Materials Issues in Silicon Integrated Circuit Processing Symposium*, (Apr. 1986),139-44.

Wijaranakula, W., et al., "Internal Gettering Heat Treatments and Oxygen Precipitation in Epitaxial Silicon Wafers", *Journal of Materials Research*, 1(5), Dept of Electr & Comput. Eng, Oregon State Univ., Corvallis, OR,(Sep.-Oct. 1986),693-7.

Wijaranakula, W., et al., "Oxygen precipitation in p/p+(100) epitaxial silicon material", *Journal of the Electrochemical Society*, 134(9), SEH America, Inc., Mater. Characterization Lab., Vancouver, WA,(Sep. 1987),2310-16.

Wild, Dipl.ing. M., "Laser Assisted Bonding of Silicon and Glass in Micro-System Technology", http://www.ilt.fhg.de/eng/jb00-s42.html. Fraunhofer ILT—jb00-s42,(2003),1.

Xuan, Peiqi, et al., "60nm Planarized Ultra-thin Body Solid Phase Epitaxy MOSFETs", *IEEE Device Research Conference, Conference Digest 58th DRC*, (Jun. 19-21, 2000),67-68.

Yang, D., et al., "Intrinsic Gettering in Nitrogen Doped Czochralski Crystal Silicon", *High Purity Silicon VI. Proceedings of the Sixth International Symposium (Electrochemical Society Proceedings*vol. 2000-17) (*SPIE* vol. 4218), (2000),357-61.

Yang, Deren, et al., "Nitrogen in Czochralski Silicon", *2001 6th International Conference on Solid-State and Integrated Circuit Technology. Proceedings*, 1(1), (2001),255-60.

Yin, Haizhou, "High Ge-Content Relaxed Si1-xGex Layers by Relaxation on Complaint Substrate with Controlled Oxidation", *Electronic Materials Conference*, Santa Barbara, Jun. 2002, 8.

Zhu, Z H., et al., "Wafer bonding and its application on compliant universal (CU) substrates", *Conference Proceedings, 10th Annual Meeting IEEE Lasers and Electro-Optics Society*, (Nov. 10-13, 1996),31.

Zhu, Z H., et al., "Wafer bonding technology and its applications in optoelectronic devices and materials", *IEEE Journal of Selected Topics in Quantum Electronics*, (Jun. 1997),927-936.

Lu, X., et al., "SiGe and SiGeC Surface Alloy Formation Using High-Dose Implantation and Solid Phase Epitaxy", *Proceedings of the 11th International Conference on Ion Implantation Technology*, Austin, TX, (1997), 686-689.

Kal, S., et al., "Strained Silicon-SiGe Devices Using Germanium Implantation", *IETE Journal of Research*, 43 (2-3), (Mar. 1997), 185-192.

Xiao, Q., et al., "Preparation of thin Strained Si Film by Low Temperature Ge Ion Implantation and High Temperature Annealing", *Solid-State and Integrated Circuits Technology, 2004. Proceedings 7th Int'l Conf.*, 3(3), (Oct. 18, 2004).

U.S. Appl. No. 11/210,927, filed Aug. 24, 2005, Micro-Mechanically Strained Semiconductor Film.

U.S. Appl. No. 11/210,373, filed Aug. 24, 2005, Strained Si/SiGe Structures by Ion Implantation.

U.S. Appl. No. 11/214,495, filed Aug. 29, 2005, Semiconductor on Insulator Structure.

U.S. Appl. No. 11/318,124, filed Dec. 23, 2005, Strained Semiconductor by Wafer Bonding With Misorientation.

"U.S. Appl. No. 10/210,373 final office action mailed Jun. 11, 2007", 17 Pgs.

"U.S. Appl. No. 10/210,373 non-final office action mailed Jan. 24, 2007", 17 Pgs.

"U.S. Appl. No. 10/431,134 Amendment under 37 C.F.R. filed Sep. 28, 2005", 16 Pgs.

"U.S. Appl. No. 10/431,134 non-final office action mailed Dec. 23, 2004", 5 Pgs.

"U.S. Appl. No. 10/431,134 Notice of allowance mailed Jun. 28, 2005", 4 Pgs.

"U.S. Appl. No. 10/431,134 Response filed Mar. 23, 2005 to non-final office action mailed Dec. 23, 2004", 19 Pgs.

"U.S. Appl. No. 10/443,337 non-final office action mailed Jan. 12, 2006", 5 Pgs.

"U.S. Appl. No. 10/443,337 non-final office action mailed Jan. 13, 2005", 6 Pgs.

"U.S. Appl. No. 10/443,337 non-final office action mailed Jan. 17, 2007", 4 Pgs.

"U.S. Appl. No. 10/443,337 non-final office action mailed Jul. 17, 2006", 5 Pgs.

"U.S. Appl. No. 10/443,337 Response filed Oct. 17, 2006 to non-final office action mailed Jul. 17, 2006", 23 Pgs.

"U.S. Appl. No. 10/443,337 Response filed Apr. 12, 2006 to non-final office action mailed Jan. 12, 2006", 23 Pgs.

"U.S. Appl. No. 10/443,337 Response filed Apr. 13, 2005 to non-final office action mailed Jan. 13, 2005", 20 Pgs.

"U.S. Appl. No. 10/443,337 Response filed Sep. 29, 2005 to non-final office action mailed Jun. 30, 2005", 21 Pgs.

"U.S. Appl. No. 10/443,337, Non-Final Office Action mailed Nov. 28, 2007", OARN,7 pgs.

"U.S. Appl. No. 11/210,373 Response filed Apr. 24, 2007 to non-final office action mailed Jan. 24, 2007", 9 pgs.

"U.S. Appl. No. 11/460,398, Non-Final Office Action mailed Oct. 24, 2007", 15 pgs.

Wolf, S., et al., "Silicon Processing For The VLSI ERA", *Lattice Press*,1, (1986), 280-286.

* cited by examiner

WAFER GETTERING USING RELAXED SILICON GERMANIUM EPITAXIAL PROXIMITY LAYERS

CROSS REFERENCE TO RELATED APPLICATIONS

This application is related to the following commonly assigned U.S. patent applications which are herein incorporated by reference in their entirety: "Strained Si/SiGe Structures by Ion Implantation," U.S. application Ser. No. 10/431,134, filed on May 7, 2003; and "Gettering of Silicon On Insulator Using Relaxed Silicon Germanium Epitaxial Proximity Layers," U.S. application Ser. No. 10/443,337, filed on May 21, 2003.

TECHNICAL FIELD

This disclosure relates generally to semiconductors, and more particularly, to wafer gettering by relaxed silicon germanium layers in close proximity to device layers.

BACKGROUND

Unwanted crystalline defects and impurities can be introduced during crystal growth or subsequent wafer fabrication processes. These defect and impurities can degrade device characteristics and overall yield. Gettering has been described as a process for moving contaminants and/or defects in a semiconductor into its bulk and away from its top surface to create a denuded zone cleared from contaminants and/or defects. Preferably, devices are built in the denuded zone.

Historically, extrinsic backside gettering was used to getter silicon wafers. Various extrinsic backside gettering processes involve damaging the backside of the wafer mechanically or by implanting argon, germanium, hydrogen or other implants, or providing a gettering layer on the backside of the wafer using a phophorosilicate glass or oxide backside layer, a polysilicon backside layer, and a silicon germanium (SiGe) backside epitaxial layer. Subsequently, "intrinsic" gettering was developed, which employed oxygen precipitation and "bulk microdefects" precipitated into the bulk of the wafer after the surface was "denuded" of oxygen. The precipitation process, the gettering effects, and the electrical characterization of defects and gettering silicon wafers have been investigated. Recently, intrinsic gettering modifications have been developed, including neutron irradiation, high boron doping, nitrogen doping, and the use of magnetic fields during crystal growth.

These gettering processes depend on the diffusion of unwanted impurities over significant distances to the gettering sites. However, modem low temperature processes have small thermal budgets, and do not afford an opportunity for significant diffusion of dopants and/or unwanted impurities. Thus, it is desirable to reduce the distance between the gettering sites and the device area. It has been previously proposed to implant various impurities in proximity to the device areas, to co-implant oxygen and silicon to form a gettering layer in close proximity to the device area, to implant helium to form cavities close to the device areas which getter impurities, and to getter material in trench isolation areas in close proximity to the device areas.

SUMMARY

The above mentioned problems are addressed and will be understood by reading and studying this specification. This application discloses the use of relaxed silicon germanium as gettering sites in close proximity to device areas. Various embodiments use ultra high vacuum chemical vapor deposition (UHV CVD) epitaxial techniques to place a relaxed silicon germanium layer immediately under the device areas. Various embodiments use ion implantation and solid phase epitaxial (SPE) regrowth to form a relaxed silicon germanium layer immediately below a silicon layer within a silicon substrate. The ion implantation and SPE regrowth method is less costly and complex than the UHV CVD process. The relaxed silicon germanium generates defects by relaxation of the silicon germanium lattice strain and/or the injection of silicon interstitials when the germanium is substitutionally incorporated into the lattice. These defects serve to getter unwanted impurities.

One aspect of this disclosure relates to a method for creating proximity gettering sites in a semiconductor wafer. In various embodiments of this method, a relaxed silicon germanium region is formed to be proximate to a device region on the semiconductor wafer. The relaxed silicon germanium region generates defects to getter impurities from the device region.

One aspect of this disclosure relates to a method for forming a semiconductor structure. A relaxed silicon germanium gettering region is formed to be proximate to a device region. Subsequent semiconductor fabrication processes are performed, including processes to fabricate a semiconductor device in the device region. Defects generated by the relaxed silicon germanium gettering region getters unwanted impurities from the device region during the subsequent semiconductor fabrication processes.

One aspect of this disclosure relates to a method for forming a transistor. A proximity gettering region is formed to be proximate to a crystalline silicon region in a wafer. The proximity gettering region includes relaxed silicon germanium. A gate dielectric is formed over the crystalline silicon region, and a gate is formed over the gate dielectric. A first diffusion region and a second diffusion region are formed in the strained crystalline silicon region. The first and second diffusion regions are separated by a channel region formed in the crystalline silicon region between the gate and the proximity gettering region. In various embodiments, the crystalline silicon region is sufficiently thin and is positioned on the silicon germanium such that a lattice mismatch strains the crystalline silicon region. In various embodiments, the crystalline silicon region is sufficiently thick such that the crystalline silicon region is not strained. Aspects of this disclosure incorporate such transistors into memory cells and/or control circuitry of memory devices.

These and other aspects, embodiments, advantages, and features will become apparent from the following description and the referenced drawings.

3C in which a single germanium implant process provides the silicon germanium layer, according to various embodiments of the present invention.

Figure 3A:
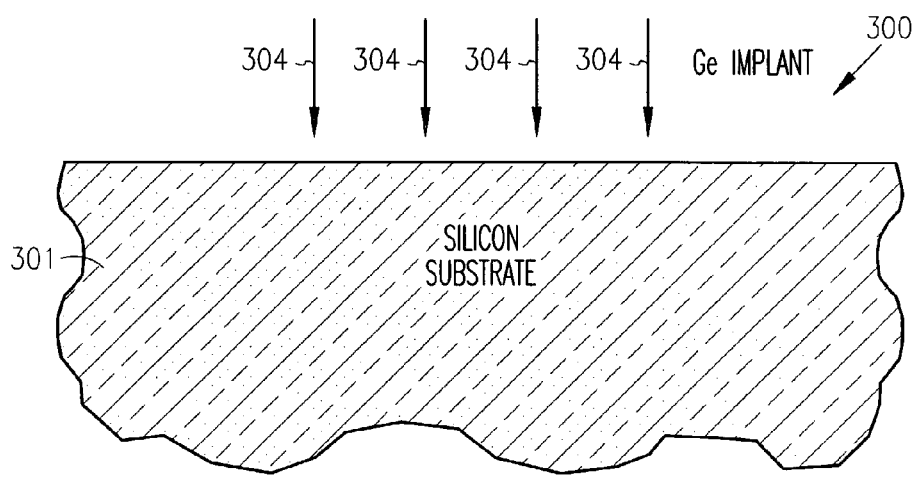
FIGS. 3A-3C illustrate a method for forming an epitaxial silicon germanium (SiGe) proximity gettering layer by ion implantation, according to various embodiments of the present invention.
Figure 3B:
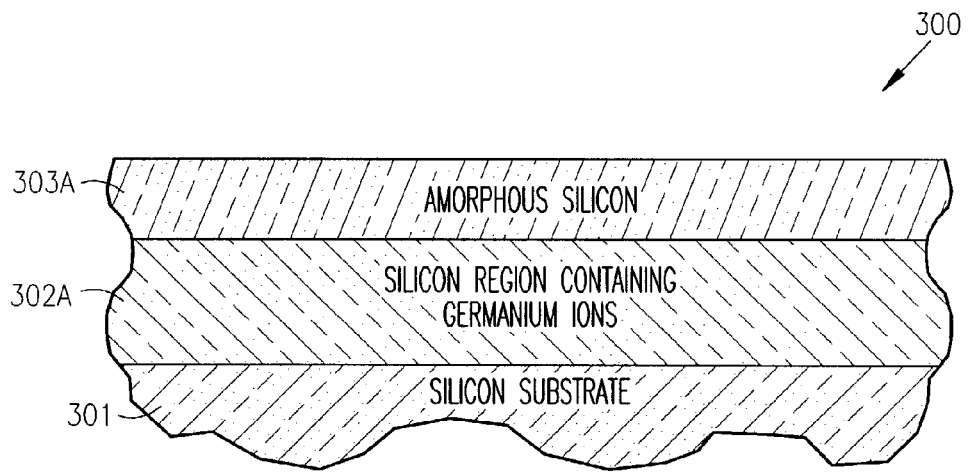
Figure 3C:
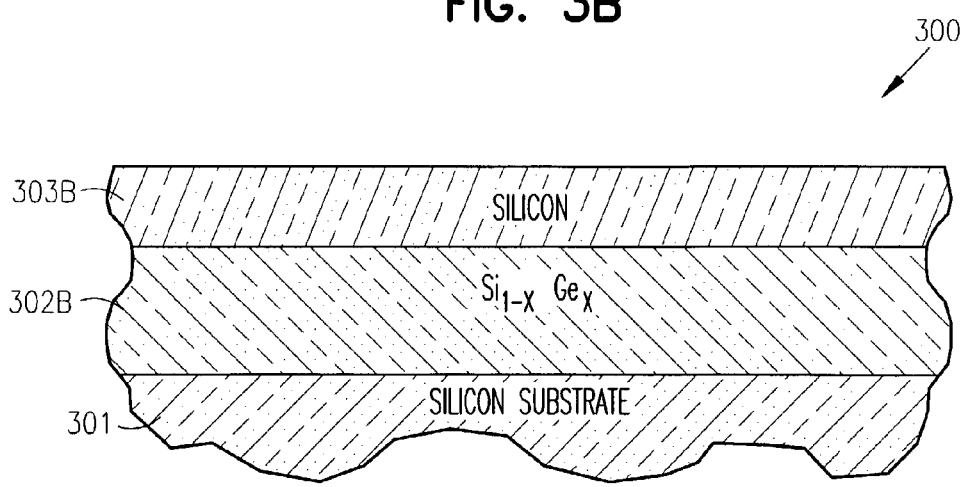
Figure 5:
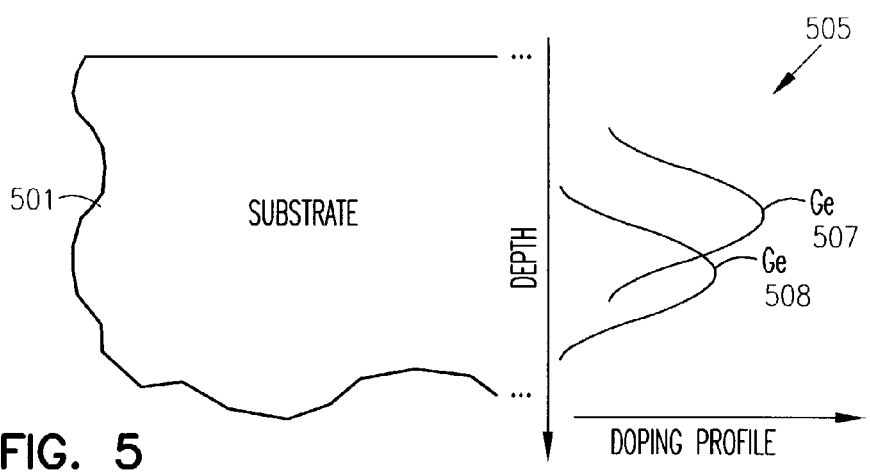

FIG. 5 illustrates a doping profile for forming an epitaxial silicon germanium (SiGe) proximity gettering layer of FIG. 3C in which multiple germanium implants provide a graded germanium concentration, according to various embodiments of the present invention.

Figure 6:
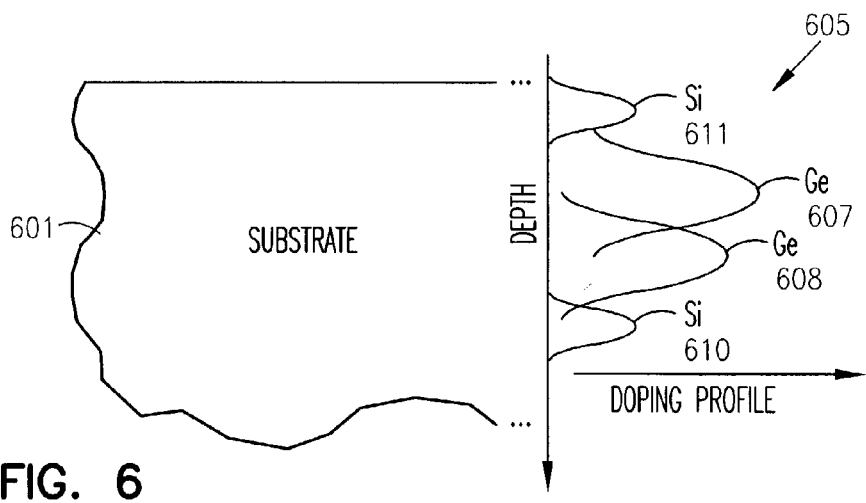

FIG. 6 illustrates a doping profile for forming an epitaxial silicon germanium (SiGe) proximity gettering layer of FIG. 3C in which multiple germanium implants provide a graded germanium concentration, a first silicon implant reduces germanium ion channeling, and a second silicon implant further amorphizes the silicon layer, according to various embodiments of the present subject mater.

Figure 7A:
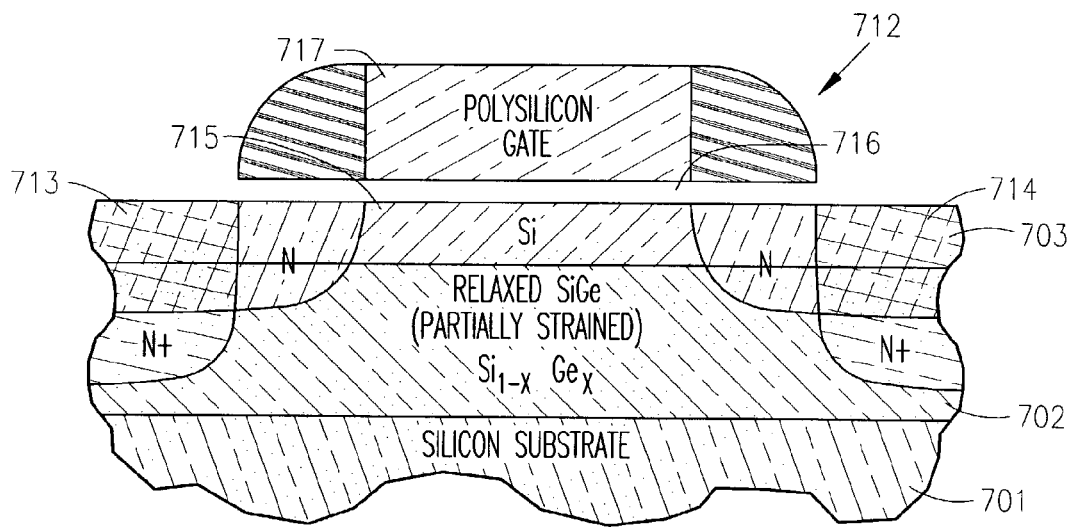
Figure 7B:
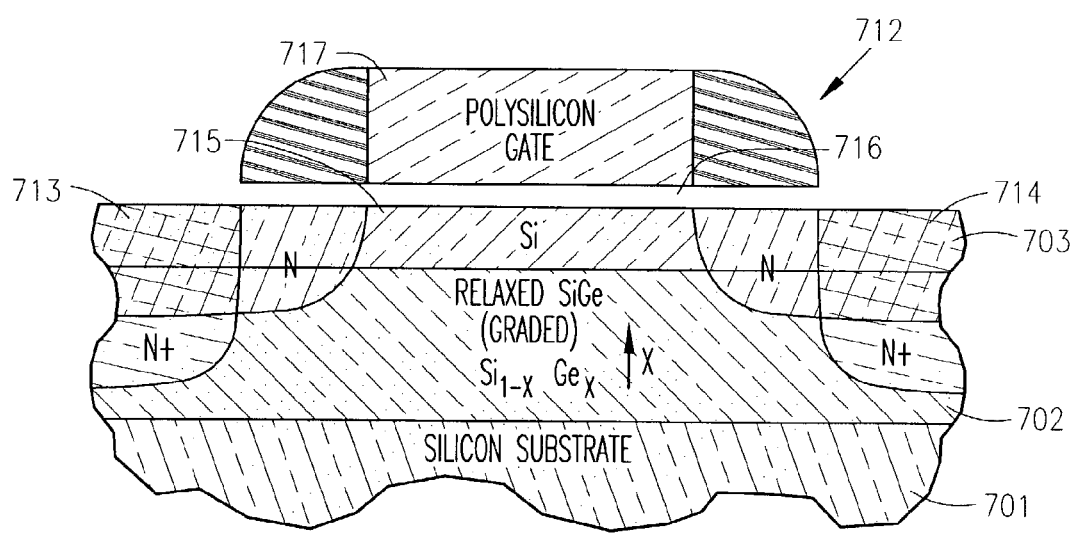

FIGS. 7A-7B illustrate a transistor structure with a silicon layer on a relaxed (partially strained and fully strained) silicon germanium layer, including a silicon layer on a partially strained silicon germanium layer and a silicon layer on a relaxed silicon germanium layer having a graded germanium concentration, respectively, according to various embodiments of the present invention.

Figure 8:
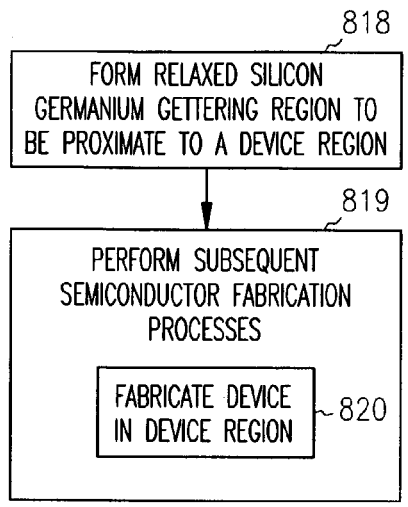

FIG. 8 illustrates a method for forming a semiconductor structure with a proximity gettering region according to various embodiments of the present invention.

Figure 9:
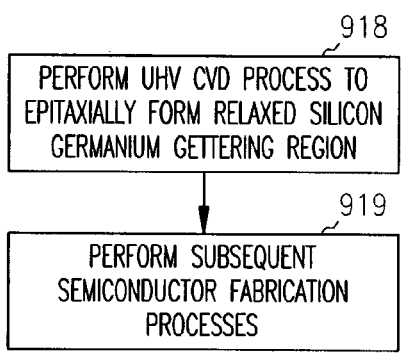

FIG. 9 illustrates a method for forming a semiconductor structure with a proximity gettering region that is formed using an ultra high vacuum chemical vapor deposition (UHV CVD) process according to various embodiments of the present invention.

Figure 10:
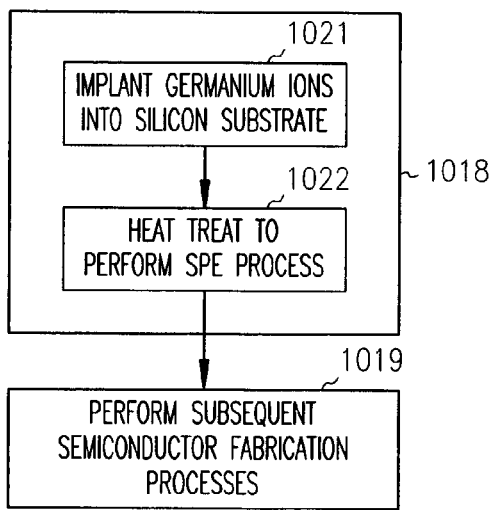

FIG. 10 illustrates a method for forming a semiconductor structure with a proximity gettering region that is formed using a process that includes implanting germanium ions into a silicon substrate and heat treating to perform a solid phase epitaxial (SPE) process according to various embodiments of the present invention.

Figure 11:
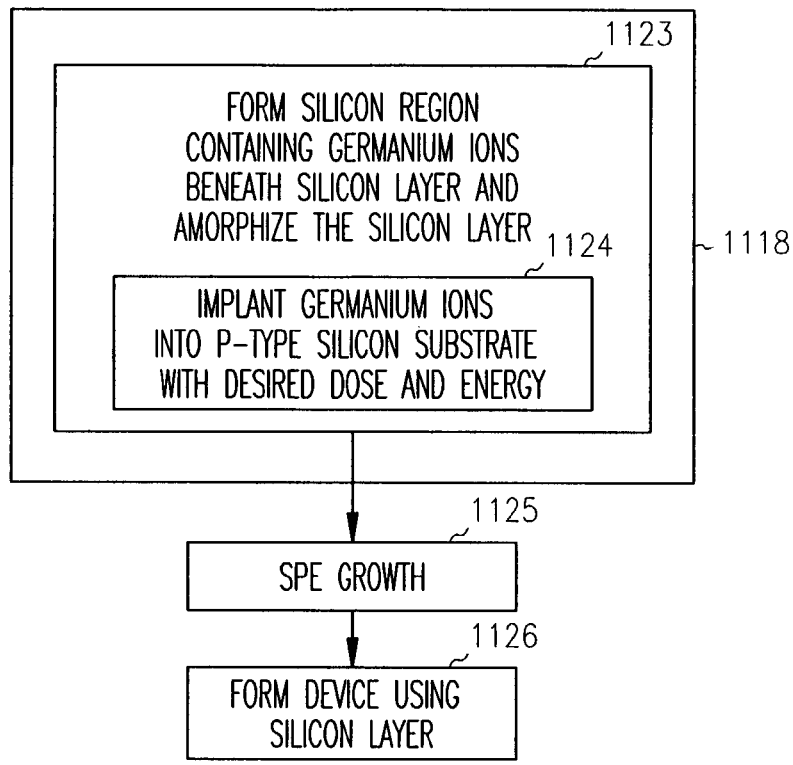

FIG. 11 illustrates a method for forming a device with a relaxed epitaxial silicon germanium (SiGe) proximity gettering layer according to various embodiments of the present invention.

Figure 12:
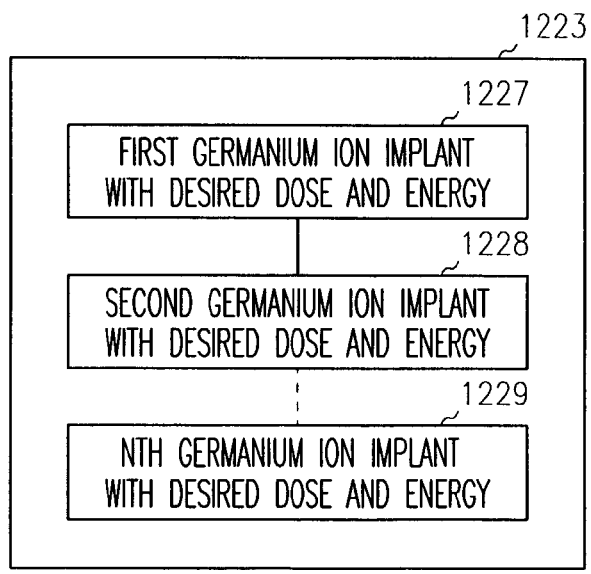

FIG. 12 illustrates a method for amorphizing the silicon layer and forming a silicon germanium layer beneath the silicon layer, according to various embodiments of the present invention.

Figure 13:
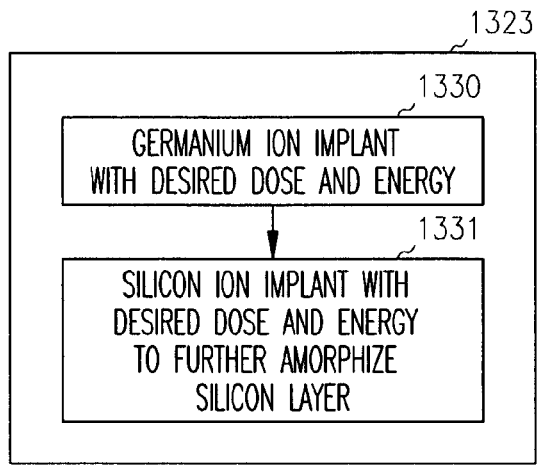

FIG. 13 illustrates a method for forming a silicon region containing germanium ions beneath a silicon layer, and amorphizing the silicon layer over the silicon region containing germanium ions, according to various embodiments of the present invention.

Figure 14:
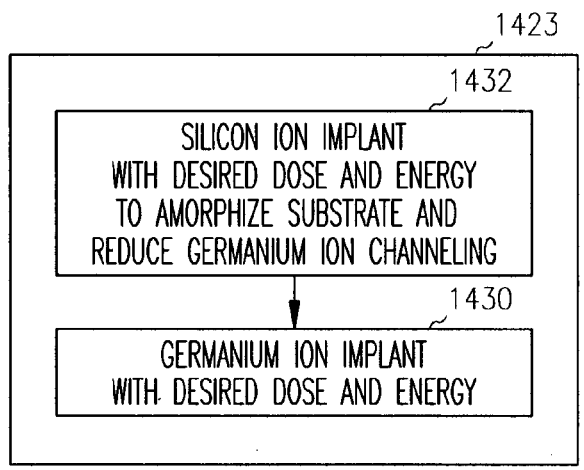

FIG. 14 illustrates a method for forming a silicon region containing germanium ions beneath a silicon layer, and amorphizing the silicon layer over the silicon region containing germanium ions, according to various embodiments of the present invention.

Figure 15:
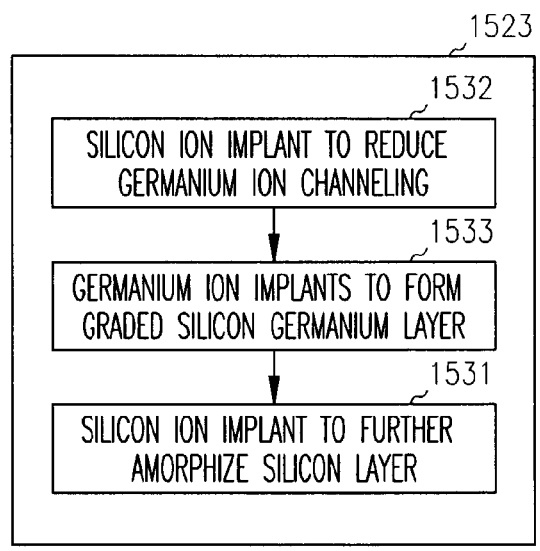

FIG. 15 illustrates a method for forming a silicon region containing germanium ions beneath a silicon layer, and amorphizing the silicon layer over the silicon region containing germanium ions, according to various embodiments of the present invention.

Figure 16:
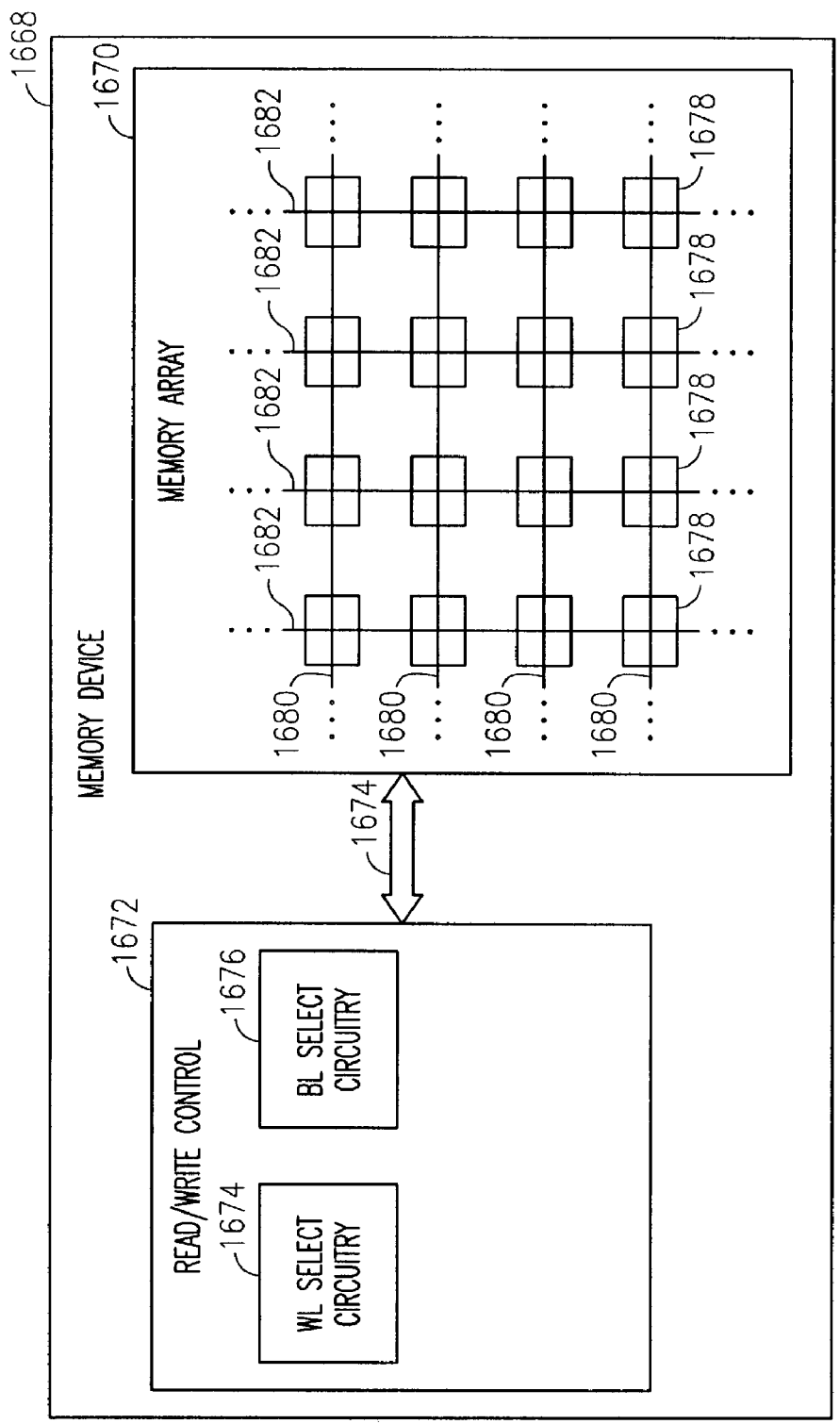

FIG. 16 is a simplified block diagram of a high-level organization of various embodiments of a memory device according to various embodiments of the present invention.

Figure 17:
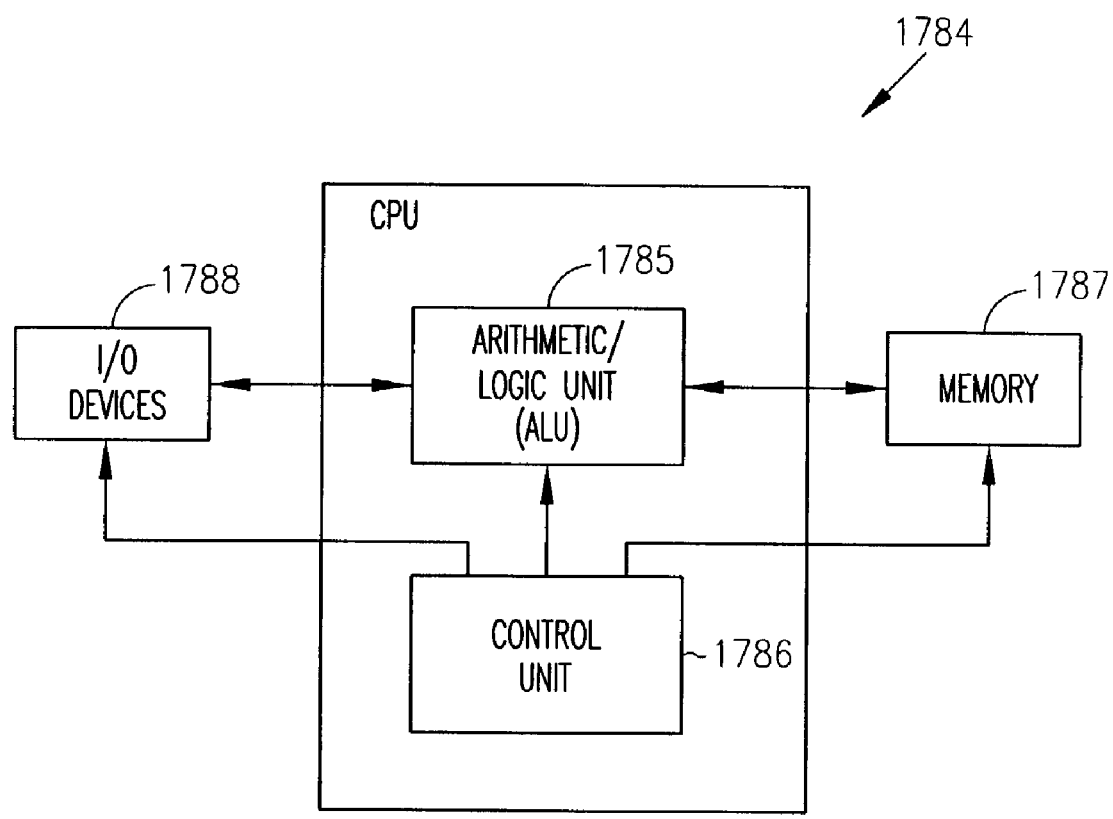

FIG. 17 is a simplified block diagram of a high-level organization of various embodiments of an electronic system according to the present invention.

DETAILED DESCRIPTION

The following detailed description refers to the accompanying drawings which show, by way of illustration, specific aspects and embodiments in which the present invention may be practiced. The various embodiments are not necessarily mutually exclusive as aspects of one embodiment can be combined with aspects of another embodiment. Other embodiments may be utilized and structural, logical, and electrical changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The terms "horizontal" and "vertical", as well as prepositions such as "on", "over" and "under" are used in relation to the conventional plane or surface of a wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A relaxed silicon germanium region or layer is formed to be proximate to a device area such that defects generated by the relaxed silicon germanium getter impurities from the device area even with the small thermal budgets associated with modem low temperature processes. In various embodiments, a UHV CVD process is used to epitaxially form a relaxed silicon germanium layer and a silicon layer on the relaxed silicon germanium layer such that the silicon germanium layer forms a proximity gettering site. In various embodiments, germanium ions are implanted into a silicon substrate, and an SPE process is performed to regrow a crystalline silicon layer over a resulting silicon germanium layer in the substrate. The defects generated by relaxation of the silicon germanium lattice strain and/or the injection of silicon interstitials when the germanium is substitutionally incorporated into the lattice serves to getter unwanted impurities.

Figure 1:
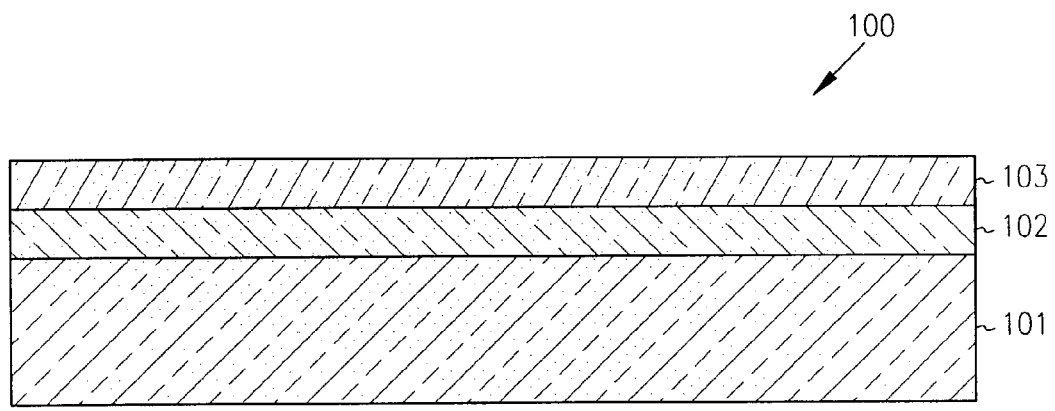
FIG. 1 illustrates a semiconductor structure having an epitaxial silicon germanium (SiGe) proximity gettering region, according to various embodiments of the present invention.

FIG. 1 illustrates a semiconductor structure having an epitaxial silicon germanium (SiGe) proximity gettering region, according to various embodiments of the present invention. The illustrated structure 100 includes a semiconductor wafer, also referred to here as a substrate 101. A proximity gettering region 102 is located near to the device region 103 such that unwanted impurities can travel a short distance from the device region 103 to the gettering region 102, even with modem low temperature processes. In various embodiments, the device region includes crystalline silicon. Semiconductor devices, such as transistors, are fabricated in the crystalline silicon. Thus, it is desired to getter unwanted impurities from the device region. The illustrated proximate gettering region includes an epitaxial relaxed silicon germanium layer. The relaxed silicon germanium layer 102 functions as a proximity gettering region as it generates defects that getter impurities from the device region 103. One of ordinary skill in the art will understand, upon reading and comprehending this disclosure, how to form the illustrated device.

Figure 2:
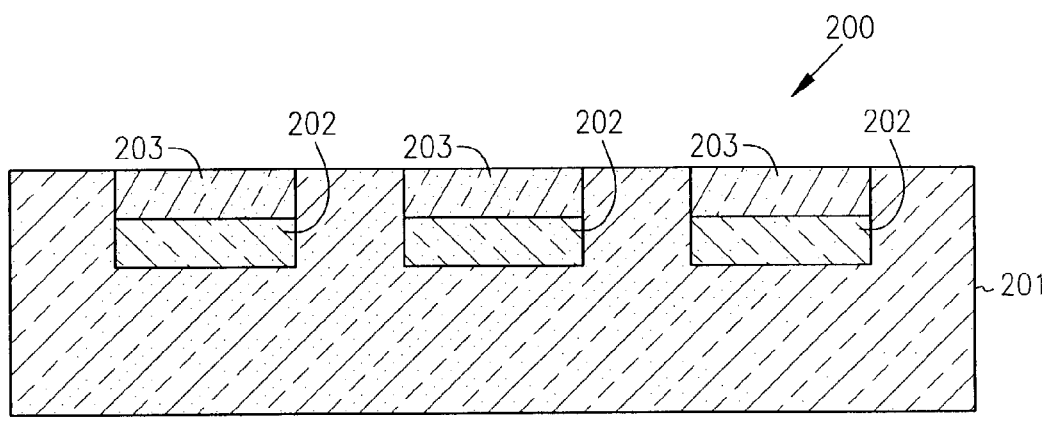
FIG. 2 illustrates a semiconductor structure having an epitaxial silicon germanium (SiGe) proximity gettering region, according to various embodiments of the present invention.

FIG. 2 illustrates a semiconductor structure having an epitaxial silicon germanium (SiGe) proximity gettering region, according to various embodiments of the present invention. The illustrated structure 200 includes a semiconductor wafer, also referred to here as a substrate 201. A number of proximity gettering regions 202 are located near to a number of device regions 203 such that unwanted impurities can travel a short distance from the device regions 203 to the gettering regions 202, even with modern low temperature processes. In various embodiments, the device region includes crystalline silicon, and semiconductor devices, such as transistors, are capable of being fabricated in the crystalline silicon. The relaxed silicon germanium regions 202 function as proximity gettering regions as it generates defects that getter impurities from the device regions 203. One of ordinary skill in the art will understand, upon reading and comprehending this disclosure, how to form the illustrated device.

FIGS. 3A-3C illustrate a method for forming an epitaxial silicon germanium (SiGe) proximity gettering layer by ion implantation, according to various embodiments of the present invention. In the illustrated embodiment, germanium ions 304 are implanted into a silicon wafer 301, such as a p-type wafer for an n-channel device, as represented in FIG. 3A. In various embodiments, the dose of the germanium ion implant is approximately $10^{20}/cm^2$, and the energy of the germanium ion implant is greater than 200 KeV.

As represented in FIG. 3B, the relatively high dose and energy of the germanium ion implant in the silicon substrate 301 results in a region of silicon that contains germanium ions, represented as 302A, on the silicon substrate 301 and further results in an amorphized, or at least a partially amorphized, silicon layer 303A at the surface. In various embodiments, if the germanium ion implant did not completely amorphize the surface silicon layer, a silicon ion implant is used to further amorphize the silicon layer. In various embodiments, the dose of this silicon ion implant to amorphize the silicon layer 303A is approximately $10^{15}/cm^2$ and the energy of this silicon ion implant is greater than approximately 170 KeV.

During an ion implantation process, the ions can channel along the crystal directions of the substrate, such that the ions do not encounter nuclei and are slowed down mainly by electronic stopping. Channeling can be difficult to control, and can cause the ions to penetrate several times deeper than intended. In various embodiments, to avoid channeling during the germanium ion implant, the silicon substrate is amorphized using a silicon ion implant to prepare the substrate for the germanium ion implant. In various embodiments, the dose of this silicon ion implant is approximately $10^{15}/cm^2$ and the energy of this silicon ion implant is greater than 170 KeV. Preparing the substrate using the silicon ion implant to amorphize the substrate results in better depth control during the germanium ion implant process.

The structure 300 is heat treated, or annealed, such that the amorphized layers are regrown by a solid phase epitaxy (SPE) process. In various embodiments, the SPE process involves heating the structures at temperatures within a range of approximately 550° C. to 700° C. for a time within a range from approximately one hour to approximately two hours. The resulting structure 300 is illustrated in FIG. 3C. The silicon region that contains germanium ions forms a silicon germanium ($Si_{1-x}Ge_x$) layer 302B and the amorphous silicon layer regrows into a crystalline silicon layer 303B over the silicon germanium layer 302B.

In various embodiments, the crystalline silicon layer is approximately 20 nm thick. However, the present invention is not limited to a particular thickness. The thickness of the crystalline silicon layer is controlled by the energy of the implant.

One of ordinary skill in the art will understand, upon reading and comprehending this disclosure, how to control the germanium implant to achieve a desired thickness of the crystalline silicon layer 303B.

The devices are formed in the silicon layer on the silicon germanium gettering layer. One of ordinary skill in the art will understand, upon reading and comprehending this disclosure, that thicker silicon wafers on the relaxed silicon germanium gettering layer are not strained, and thinner silicon wafers on the relaxed silicon germanium gettering layer are strained. For example, ultra thin silicon layers having a thickness of approximately 2000 Å or less are strained by the lattice mismatch with the relaxed silicon germanium gettering layer. In various embodiments, the silicon layer has a thickness of approximately 1000 Å or less. In various embodiments, the silicon layer has a thickness within a range of approximately 300 Å to approximately 1000 Å.

One area of interest for improving the speed and performance of semiconductor devices includes strained silicon technology, which has been shown to enhance carrier mobility in both n-channel and p-channel devices, and is being considered to improve the electron mobility and drift velocity in n-channel MOSFETs in CMOS technology.

Thin layers of strained silicon are being considered for CMOS n-channel devices. Thinner layers of silicon are more tolerant of strain. One technique for producing strained silicon involves epitaxially growing the silicon and silicon germanium layers using an ultra-high vacuum chemical vapor deposition (UHV CVD) process, a costly and complex process, to form silicon layers on relaxed silicon germanium layers. A large mismatch in the cell structure causes a pseudo-morphic layer of silicon on relaxed silicon germanium to be under biaxial tensile strain. The biaxial strain modifies the band structure and enhances carrier transport in the silicon layer. The strain on the silicon layer depends of the lattice constant difference between silicon and silicon germanium. The lattice constant of silicon germanium is between the lattice constant of silicon (5.43095 Å) and the lattice constant of germanium (5.64613 Å), and depends on the percentage of germanium in the silicon germanium layer.

Upon reading and comprehending this disclosure, one of ordinary skill in the art will appreciate the benefits of strained silicon. The strained silicon layer improves the electron mobility in the n-channel transistors in CMOS technology. A pseudo-morphic layer of silicon on relaxed silicon germanium is under biaxial tensile strain, which modifies the band structure and enhances carrier transport. In an electron inversion layer, the subband splitting is large in strained silicon because of the strain-induced band splitting in addition to that provided by quantum confinement. The ground level splitting in a MOS inversion layer at 1 MV/cm transverse field is about 120 and 250 meV for unstrained and strained silicon, respectively. The increase in energy splitting reduces inter-valley scattering and enhances NMOSFET mobility, as demonstrated at low (<0.6 MV/cm) and higher (approximately 1 MV/cm) vertical fields. The scaled $g_m$ is also improved due to the reduced density of states and enhanced non-equilibrium transport. The germanium content can be graded in steps to form a fully relaxed silicon germanium buffer layer before a thin strained silicon channel layer is grown. X-ray diffraction analysis is used to quantify the germanium content and strain relaxation in the silicon germanium layer. The strain state of the silicon channel layer can be confirmed by Raman spectroscopy.

The lattice mismatch of the silicon surface layer with the underlying silicon germanium layer 302B causes the silicon layer 303B to be strained. In various embodiments, N-channel CMOS devices are fabricated in this strained silicon layer 303B using conventional techniques, which are not described here for the sake of brevity.

One of ordinary skill in the art will understand, upon reading and comprehending this disclosure, that the concentration (X) of germanium in the silicon is controlled by the dose and energy of the germanium ion implant process. Additionally, one of ordinary skill in the art will understand, upon reading and comprehending this disclosure, that the concentration (X) of germanium in the silicon can be graded by controlling the dose and energy of two or more germanium ion implant process. A benefit of grading germanium concentration involves forming a silicon germanium layer on a silicon substrate to have a relaxed silicon germanium surface upon which the crystalline silicon layer is regrown.

Figure 4:
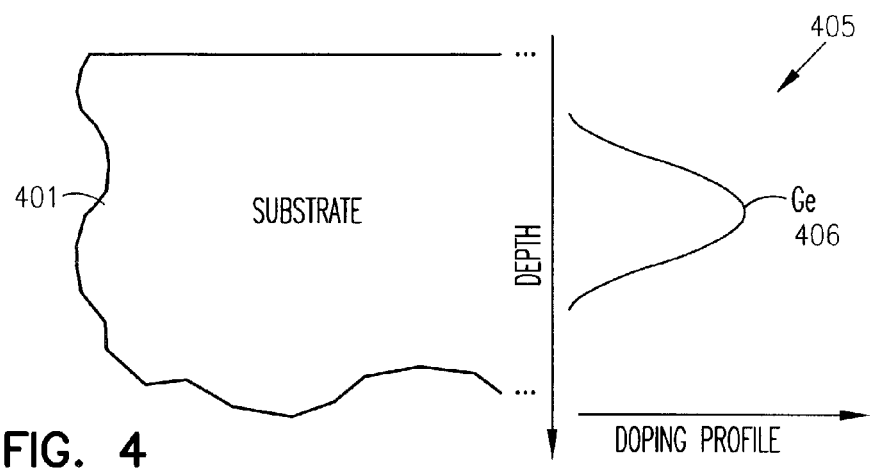
FIG. 4 illustrates a doping profile for forming an epitaxial silicon germanium (SiGe) proximity gettering layer of FIG.

FIG. 4 illustrates a doping profile for forming an epitaxial silicon germanium (SiGe) proximity gettering layer of FIG. 3C in which a single germanium implant process provides the silicon germanium layer, according to various embodiments of the present invention. The left side of the figure illustrates a silicon substrate 401, and the right side of the figure represents a germanium ion doping profile 405. The profile 405 illustrates a single germanium ion implantation process step 406, in which germanium ions are implanted at a desired dose and energy to form the silicon region containing germanium ions, represented at 302A in FIG. 3B.

FIG. 5 illustrates a doping profile for forming an epitaxial silicon germanium (SiGe) proximity gettering layer of FIG. 3C in which multiple germanium implants provide a graded germanium concentration, according to various embodiments of the present invention. The left side of the figure illustrates a silicon substrate 501, and the right side of the figure represents a germanium ion doping profile 505. The profile 505 illustrates a first germanium ion implantation process step 507 in which germanium ions are implanted at a first desired dose and energy and a second germanium ion implantation step 508 in which germanium ions are implanted at a second desired dose and energy. These germanium ion implant steps form the silicon region containing germanium ions, represented at 302A in FIG. 3B. The concentration of the germanium in the silicon is graded. One of ordinary skill in the art will appreciate, upon reading and comprehending this disclosure, that additional germanium ion implant steps can be performed to control the germanium concentration, and that a relaxed silicon germanium layer can be formed by appropriately grading the germanium ion content such that less germanium ions are implanted near the silicon substrate, and more and more germanium ions are implanted closer to the silicon layer. One of ordinary skill in the art will appreciate, upon reading and comprehending this disclosure, that without grading the germanium concentration, the resulting silicon germanium layer has a slight strain attributable to the lattice mismatch of the silicon germanium layer and the silicon substrate beneath the silicon germanium layer. Various embodiments include silicon germanium layer that have a relaxed surface and that have a slightly strained surface.

FIG. 6 illustrates a doping profile for forming an epitaxial silicon germanium (SiGe) proximity gettering layer of FIG. 3C in which multiple germanium implants provide a graded germanium concentration, a first silicon implant reduces germanium ion channeling, and a second silicon implant further amorphizes the silicon layer, according to various embodiments of the present subject matter. The left side of the figure illustrates a silicon substrate 601 and the right side of the figure illustrates a doping profile 605. The first silicon implant 610 prepares the silicon substrate 601 for the germanium ion implantion by amorphizing the substrate to a desired depth. Thus, undesirable channeling is reduced, and the depth of the germanium ion implants 607 and 608 can be more accurately controlled. As discussed above with respect to FIG. 5, the multiple germanium ion implant steps provide a graded germanium concentration, which results in a relaxed, or at least partially relaxed, silicon germanium surface upon which a crystalline silicon layer is regrown from an amorphized silicon layer located over the silicon region that contains germanium ions. The implantation of the germanium ions at least partially amorphizes the silicon layer. The second silicon implant 611 further amorphizes the silicon layer in preparation for regrowing the crystalline silicon layer.

FIGS. 7A-7B illustrate a transistor structure with a silicon layer on a relaxed (partially strained and fully strained) silicon germanium layer, including a silicon layer on a partially strained silicon germanium layer and a silicon layer on a relaxed silicon germanium layer having a graded germanium concentration, respectively, according to various embodiments of the present invention. Both FIGS. 7A and 7B illustrate a transistor structure 712 such as may be formed on a p-type silicon substrate 701. One of ordinary skill in the art will understand, upon reading and comprehending this disclosure, that the transistor structure 712 may be formed on a n-type silicon substrate. A silicon germanium layer ($Si_{1-x}Ge_x$) 702 is positioned over the silicon substrate 701, and a silicon layer 703 is positioned over the silicon germanium layer ($Si_{1-x}Ge_x$) layer. The formation of the silicon germanium ($Si_{1-x}Ge_x$) layer 702 and the silicon layer 703 has been described above. First and second diffusion regions 713 and 714 are formed by implanting n-type impurities. The illustrated structures show each diffusion region with an n-type area and an n+ type area. If the silicon substrate is an n-type substrate, the first and second diffusion regions are formed by implanting p-type impurities. The illustrated diffusion regions are formed in the silicon layer, and extend into the silicon germanium layer. The silicon layer 703 forms a channel region 715 which extends between the diffusion regions 713 and 714. A gate dielectric 716 (such as a gate oxide), is formed over the channel region 715, and a gate 717 is formed over the gate dielectric 716 to control electron current through the channel region 715 between the n-type diffusion regions 713 and 714.

The silicon germanium layer 702 in the structure illustrated in FIG. 7A is formed without grading the germanium ion content. The lattice mismatch of the silicon substrate 701 beneath the silicon germanium layer 702 causes the surface of the silicon germanium layer to be partially strained. The germanium ion content is graded to form the relaxed silicon germanium layer 702 in the structure illustrated in FIG. 7B. As represented by the arrow and the reference "X", the germanium content increases further away from the silicon substrate. This grading of the germanium content reduces the effect that the lattice mismatch between the silicon substrate 701 and the silicon germanium layer 702. Thus, the surface of the silicon germanium layer is relaxed, or at least partially relaxed.

In various embodiments, the silicon layer 703 is sufficiently thick such that it is not strained by a lattice mismatch between the silicon germanium 702 and the silicon layer 703. In various embodiments, the silicon layer 703 is sufficiently thin to be strained by a lattice mismatch between the silicon germanium 702 and the silicon layer 703. In various embodiments, the thin silicon layer is ultra thin. In various embodiments, the thin silicon layer has a thickness of approximately 2000 Å or less. In various embodiments, the thin silicon layer has a thickness of approximately 1000 Å or less. In various embodiments, the thin silicon layer has a thickness in a range of approximately 300 Å to approximately 1000 Å.

FIG. 8 illustrates a method for forming a semiconductor structure with a proximity gettering region according to various embodiments of the present invention. In the illustrated embodiment, a relaxed silicon germanium gettering region is formed to be proximate to a device region at 818. At 819, subsequent semiconductor fabrication processes are performed. In various embodiments, these subsequent semiconductor processes include fabricating device(s) in the device region, as represented at 820. The relaxed silicon germanium generates defects that function to getter impurities from the device region. The proximity of the gettering region to the device region allow the gettering region to remove unwanted impurities from the device region even in modem semiconductor fabrication processes that have small thermal budgets.

FIG. 9 illustrates a method for forming a semiconductor structure with a proximity gettering region that is formed using an ultra high vacuum chemical vapor deposition (UHV CVD) process according to various embodiments of the present invention. At 918, a UHV CVD process is performed to epitaxially form a relaxed silicon germanium gettering region. This generally corresponds to 818 previously shown in FIG. 8. At 919, subsequent semiconductor fabrication processes are performed. This generally corresponds to 819 previously shown in FIG. 8.

FIG. 10 illustrates a method for forming a semiconductor structure with a proximity gettering region that is formed using a process that includes implanting germanium ions into a silicon substrate and heat treating to perform a solid phase epitaxial (SPE) process according to various embodiments of the present invention. At 1018, a relaxed silicon germanium gettering region is formed to be proximate to a device region. In the illustrated embodiment, forming the gettering region includes implanting germanium ions into a silicon substrate at 1021, and heat treating the substrate to perform a solid phase epitaxial (SPE) process at 1022. This was previously illustrated and described in FIGS. 3A-3C, and as such will not be described here for the sake of brevity. At 1019, subsequent semiconductor fabrication processes are performed. This generally corresponds to 819 previously shown in FIG. 8.

FIG. 11 illustrates a method for forming a device with a relaxed epitaxial silicon germanium (SiGe) proximity gettering layer according to various embodiments of the present invention. At 1118, a relaxed silicon germanium gettering region is formed to be proximate to a device region. In the illustrated embodiment, a silicon region containing germanium ions is formed beneath a silicon layer, and the silicon layer over the silicon region containing germanium ions is amorphized, as represented at 1123. In various embodiments, as represented at 1124, germanium ions are implanted into a p-type silicon substrate with a desired dose and energy to form the silicon region containing germanium ions. Various embodiments implant germanium ions into an n-type silicon substrate. The implantation of the germanium ions also amorphizes, or at least partially amorphizes, the silicon layer over the silicon region containing germanium ions. This silicon layer serves as a device region. Thus, it is desired to remove unwanted impurities from the silicon layer. At 1125, a solid phase epitaxy (SPE) growth process is performed to form a crystalline silicon layer over a silicon germanium region. Defects generated by the relaxed silicon germanium proximity layer getter impurities from the crystalline silicon layer. In various embodiments, the crystalline silicon layer is sufficiently thin such that the lattice mismatch between the crystalline silicon layer and the silicon germanium causes the crystalline silicon layer to be strained. At 1126, a device is formed using the silicon layer. In various embodiments, the silicon layer is strained such that the device incorporates strained silicon that enhances mobility.

FIG. 12 illustrates a method for amorphizing the silicon layer and forming a silicon germanium layer beneath the silicon layer, according to various embodiments of the present invention. The illustrated method is represented generally at 1223, which generally corresponds to 1123 in FIG. 11. At 1227, a first germanium ion implant is performed with a first desired dose and energy. At 1228, a second germanium ion implant is performed with a second desired dose and energy. Additional germanium implants can be performed according to various embodiments. Thus, the figure illustrates, at 1229, an Nth germanium ion implant performed with an Nth desired does and energy. The illustrated method is useful to create a silicon region with a graded concentration of germanium ions, such that upon annealing, a resulting silicon germanium layer has a desired graded germanium concentration.

FIG. 13 illustrates a method for forming a silicon region containing germanium ions beneath a silicon layer, and amorphizing the silicon layer over the silicon region containing germanium ions, according to various embodiments of the present invention. The illustrated method is represented generally at 1323, which generally corresponds to 1123 in FIG. 11. At 1330, a germanium ion implant is performed with a desired dose and energy to form a silicon region containing germanium ions within a silicon substrate. This germanium ion implant partially amorphizes the silicon layer positioned over the silicon region containing germanium ions. At 1331, a silicon ion implant is performed with a desired dose and energy to further amorphize the silicon layer in preparation for the SPE growth process, illustrated at 1125 in FIG. 11.

FIG. 14 illustrates a method for forming a silicon region containing germanium ions beneath a silicon layer, and amorphizing the silicon layer over the silicon region containing germanium ions, according to various embodiments of the present invention. The illustrated method is represented generally at 1423, which generally corresponds to 1123 in FIG. 11. At 1432, a silicon ion implant is performed with a desired dose and energy to prepare the silicon substrate for germanium ion implantation. The silicon ion implant amorphizes the silicon substrate to a desired depth to reduce channeling of the germanium ions. At 1430, a germanium ion implant is performed with a desired dose and energy to form a silicon region containing germanium ions within the amorphized silicon substrate. Reducing the unpredictable channeling by amorphizing the substrate permits better control of the depth of the germanium ion implant.

FIG. 15 illustrates a method for forming a silicon region containing germanium ions beneath a silicon layer, and amorphizing the silicon layer over the silicon region containing germanium ions, according to various embodiments of the present invention. The illustrated method is represented generally at 1523, which generally corresponds to 1123 in FIG. 11. At 1532, a first silicon ion implant is performed with a desired dose and energy to prepare the silicon substrate for germanium ion implantation. The silicon ion implant amorphizes the silicon substrate to a desired depth to reduce channeling of the germanium ions. At 1533, a number of germanium ion implant steps are performed to create a silicon region with a graded concentration of germanium ions in the amorphized silicon substrate, such that upon annealing, a resulting silicon germanium layer has a desired graded germanium concentration. The first silicon implant reduces the unpredictable channeling and permits better control of the depth of the germanium ion implants These germanium ion implant steps at least partially amorphize the silicon layer positioned over the silicon region containing germanium ions. At 1531, a second silicon ion implant is performed with a desired dose and energy to further amorphize the silicon layer in preparation for the SPE growth process, illustrated at 1125 in FIG. 11.

FIG. 16 is a simplified block diagram of a high-level organization of various embodiments of a memory device according to various embodiments of the present invention. The illustrated memory device 1668 includes a memory array 1670 and read/write control circuitry 1672 to perform operations on the memory array via communication line(s) 1674. The illustrated memory device 1668 may be a memory card or a memory module such as a single inline memory module (SIMM) and dual inline memory module (DIMM). One of ordinary skill in the art will understand, upon reading and comprehending this disclosure, that semiconductor components in the memory array 1670 and/or the control circuitry 1672 are able to be fabricated using the relaxed silicon germanium proximity gettering regions, as described above. The structure and fabrication methods for these strained body layers have been described above.

The memory array 1670 includes a number of memory cells 1678. The memory cells in the array are arranged in rows and columns. In various embodiments, word lines 1680 connect the memory cells in the rows, and bit lines 1682 connect the memory cells in the columns. The read/write control circuitry 1672 includes word line select circuitry 1674, which functions to select a desired row. The read/write control circuitry 1672 further includes bit line select circuitry 1676, which functions to select a desired column.

FIG. 17 is a simplified block diagram of a high-level organization of various embodiments of an electronic system according to the present invention. In various embodiments, the system 1784 is a computer system, a process control system or other system that employs a processor and associated memory. The electronic system 1784 has functional elements, including a processor or arithmetic/logic unit (ALU) 1785, a control unit 1786, a memory device unit 1787 (such as illustrated in FIG. 14) and an input/output (I/O) device 1788. Generally such an electronic system 1784 will have a native set of instructions that specify operations to be performed on data by the processor 1785 and other interactions between the processor 1785, the memory device unit 1787 and the I/O devices 1788. The control unit 1786 coordinates all operations of the processor 1785, the memory device 1787 and the I/O devices 1788 by continuously cycling through a set of operations that cause instructions to be fetched from the memory device 1787 and executed. According to various embodiments, the memory device 1787 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include the silicon germanium proximity gettering region in accordance with various embodiments of the present invention.

The illustration of the system 1784 is intended to provide a general understanding of one application for the structure and circuitry, and is not intended to serve as a complete description of all the elements and features of an electronic system using proximity gettering regions according to the various embodiments of the present invention. As one of ordinary skill in the art will understand, such an electronic system can be fabricated in single-package processing units, or even on a single semiconductor chip, in order to reduce the communication time between the processor and the memory device.

Applications containing a gettering region as described in this disclosure include electronic systems for use in memory modules, device drivers, power modules, communication modems, processor modules, and application-specific modules, and may include multilayer, multichip modules. Such circuitry can further be a subcomponent of a variety of electronic systems.

CONCLUSION

Various embodiments disclosed herein provide methods to getter silicon wafers using a relaxed silicon germanium epitaxial layer immediately under the device areas. In various embodiments, the relaxed silicon germanium epitaxial layer are formed by implantation and solid phase epitaxial regrowth. In various embodiments, the relaxed silicon germanium layers are formed by UHV CVD epitaxial techniques. The relaxation of the silicon germanium lattice strain and/or the injection of silicon interstitials when the germanium is substitutionally incorporated into the lattice to generate defects. These defects serve to getter unwanted impurities from the device areas.

This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A method comprising:
   gettering a device region in a semiconductor wafer, wherein:
      gettering includes forming a relaxed silicon germanium region to be proximate to the device region;
      forming the relaxed silicon germanium region includes:
         implanting germanium ions into a silicon substrate using at least a first doping profile and a second doping profile, the first doping profile to implant germanium ions with a desired dose and energy to provide a first concentration of germanium ions at a first depth in the silicon substrate, the second doping profile to provide a second concentration of germanium ions at a second depth in the silicon substrate, wherein the first depth in the silicon substrate is lower than the second depth and the first concentration is lower than the second concentration; and
         annealing to transform the silicon substrate with the first and second concentrations of germanium ions into the relaxed silicon germanium region, wherein the relaxed silicon germanium region has a graded germanium content,
   wherein the relaxed silicon germanium region generates defects to getter impurities from the device region.

2. The method of claim 1, wherein forming the relaxed silicon germanium region includes forming a partially strained silicon germanium region.

3. A method comprising:
gettering a device region in a semiconductor wafer, wherein gettering includes forming a relaxed silicon germanium region to be proximate to the device region, wherein forming a relaxed silicon germanium region includes:
   implanting germanium ions into a silicon substrate with a desired dose and energy to form a silicon region containing germanium ions beneath a silicon layer in the substrate and to at least partially amorphize the silicon layer,
      wherein implanting germanium ions includes implanting germanium ions into a silicon substrate using at least a first doping profile and a second doping profile, the first doping profile to implant germanium ions with a desired dose and energy to provide a first concentration of germanium ions at a first depth in the silicon substrate, the second doping profile to provide a second concentration of germanium ions at a second depth in the silicon substrate, wherein the first depth in the silicon substrate is lower than the second depth and the first concentration is lower than the second concentration; and
   heat treating the substrate to transform the silicon region containing germanium ions into the silicon germanium region and to form a crystalline silicon layer over the silicon germanium region using a solid phase epitaxial (SPE) process, the crystalline silicon layer including the device region,
wherein the relaxed silicon germanium region generates defects to getter impurities from the device region.

4. A method for creating proximity gettering sites in a semiconductor wafer, comprising:
forming a relaxed silicon germanium region to be proximate to a device region on the semiconductor wafer, wherein forming a relaxed silicon germanium region includes:
   implanting germanium ions into a silicon substrate with a desired dose and energy to form a silicon region containing germanium ions beneath a silicon layer in the substrate and to at least partially amorphize the silicon layer; and
   heat treating the substrate to transform the silicon region containing germanium ions into the silicon germanium region and to form a crystalline silicon layer over the silicon germanium region using a solid phase epitaxial (SPE) process, the crystalline silicon layer including the device region,
wherein the relaxed silicon germanium region generates defects to getter impurities from the device region,
wherein implanting germanium ions into a silicon substrate includes performing two or more germanium ion implants where each germanium ion implant has a desired dose and energy such that the two or more germanium ion implants form the silicon germanium layer with a desired graded germanium content.

5. The method of claim 4,
further comprising further amorphizing the silicon layer over the silicon germanium layer before heat treating the substrate.

6. The method of claim 4,
further comprising preparing the substrate to discourage ion channeling before implanting germanium ions into the silicon substrate.

7. The method of claim 4,
wherein implanting germanium ions includes implanting germanium ions to form the silicon germanium region with a partially strained surface upon which the crystalline silicon layer is regrown.

8. The method of claim 4, wherein heat treating the substrate includes heat treating the substrate with a temperature in a range from approximately 550° C. to approximately 700° C. for a period of time in a range from approximately one hour to approximately two hours.

9. The method of claim 4, wherein
the crystalline silicon layer is sufficiently thick such that the crystalline silicon layer is not strained by a lattice mismatch with the silicon germanium region.

10. The method of claim 4, wherein
the crystalline silicon layer is sufficiently thin such that the crystalline silicon layer is strained by a lattice mismatch with the silicon germanium region; and
the strain in the crystalline silicon layer enhances carrier mobility.

11. The method of claim 10, wherein the crystalline silicon layer has a thickness less than approximately 2000 Å.

12. The method of claim 10, wherein the crystalline silicon layer has a thickness of approximately 1000 Å or less.

13. The method of claim 10, wherein the crystalline silicon layer has a thickness within a range of approximately 300 Å to approximately 1000 Å.

14. A method comprising:
gettering a device region in a silicon wafer, wherein gettering includes forming a relaxed silicon germanium region to contact a crystalline silicon layer for the device region on the semiconductor wafer, including:
   implanting silicon ions with a desired dose and a desired energy into a silicon substrate to amorphize the silicon substrate to a desired depth to discourage ion implant channeling;
   implanting germanium ions into the silicon substrate with at least a first desired dose and energy and a second desired dose and energy to form a silicon region containing germanium ions beneath a silicon layer in the substrate and to at least partially amorphize the silicon layer, the first desired dose and energy to provide a first concentration of germanium ions at a first depth in the silicon substrate and the second desired dose and energy to provide a second concentration of germanium ions more than the first concentration at a second depth in the silicon substrate higher than the first depth to provide a graded germanium concentration;
   implanting silicon ions with a desired dose and energy to further amorphize the silicon layer; and
   heat treating the substrate to transform the silicon region containing germanium ions to a relaxed silicon germanium layer and form a crystalline silicon layer over the silicon germanium layer using a solid phase epitaxial (SPE) process, the crystalline silicon layer being strained by a lattice mismatch between the silicon germanium layer and the crystalline silicon layer,
wherein the relaxed silicon germanium region generates defects to getter impurities from the crystalline silicon layer.

15. The method of claim 14, wherein:
implanting silicon ions with a desired dose and a desired energy into a silicon substrate to amorphize the silicon substrate to a desired depth to discourage ion implant channeling includes implanting silicon ions with an energy greater than approximately 170 KeV and a dose of approximately $10^{15}$/cm$^2$;

implanting germanium ions into the silicon substrate with at least a first desired dose and energy includes implanting germanium ions with an energy of approximately 200 KeV and a dose of approximately $10^{20}$/cm$^2$; and implanting silicon ions with a desired dose and energy to further amorphize the silicon layer includes implanting silicon ions with an energy less than approximately 170 KeV and a dose of approximately $10^{15}$/cm$^2$.

16. A method for creating proximity gettering sites in a silicon wafer, comprising:

forming a relaxed silicon germanium region to contact a crystalline silicon layer for a device region on the semiconductor wafer, including:

implanting silicon ions with a desired dose and a desired energy into a silicon substrate to amorphize the silicon substrate to a desired depth to discourage ion implant channeling;

implanting germanium ions into the silicon substrate with at least a first desired dose and energy to form a silicon region containing germanium ions beneath a silicon layer in the substrate and to at least partially amorphize the silicon layer, the first desired dose and energy and the second desired dose and energy providing a graded germanium concentration;

implanting silicon ions with a desired dose and energy to further amorphize the silicon layer; and heat treating the substrate to transform the silicon region containing germanium ions to a relaxed silicon germanium layer and form a crystalline silicon layer over the silicon germanium layer using a solid phase epitaxial (SPE) process, the crystalline silicon layer being strained by a lattice mismatch between the silicon germanium layer and the crystalline silicon layer, wherein the relaxed silicon germanium region generates defects to getter impurities from the crystalline silicon layer, wherein implanting germanium ions into the silicon substrate with at least a first desired dose and energy includes implanting germanium ions with a second desired dose and energy such that the first desired dose and energy and the second desired dose and energy provide a graded germanium concentration.

17. The method of claim 14, wherein heat treating the substrate to regrow a crystalline silicon layer over a resulting silicon germanium layer using a solid phase epitaxial (SPE) process includes heat treating the substrate with a temperature in a range from approximately 550° C. to approximately 700° C. for a period of time in a range from approximately one hour to approximately two hours.

18. The method of claim 4, further comprising performing subsequent semiconductor fabrication processes, including fabricating a semiconductor device in the device region, wherein the defects generated by the relaxed silicon germanium gettering region getters unwanted impurities from the device region during the subsequent semiconductor fabrication processes.

19. The method of claim 9, further comprising forming a transistor, wherein forming the transistor includes:

forming a gate dielectric over the crystalline silicon region;

forming a gate over the gate dielectric; and forming a first diffusion region and a second diffusion region in the crystalline silicon region, the first and second diffusion regions being separated by a channel region formed in the crystalline silicon region between the gate and the proximity gettering region.

20. A method for forming a memory device, comprising:

forming a memory array in a semiconductor substrate, including forming a plurality of memory cells in rows and columns and forming at least one transistor for each of the plurality of memory cells;

forming a plurality of word lines, including connecting each word line to a row of memory cells;

forming a plurality of bit lines, including connecting each bit line to a column of memory cells;

forming control circuitry in the semiconductor substrate, including forming word line select circuitry and bit line select circuitry for use to select a number of memory cells for writing and reading operations, wherein at least one of forming the memory array and forming the control circuitry includes forming at least one transistor, including:

forming a proximity gettering region to be proximate to a crystalline silicon region in a wafer, the proximity gettering region including relaxed silicon germanium, the crystalline silicon region being positioned on the silicon germanium such that a lattice mismatch strains the crystalline silicon region;

forming a gate dielectric over the crystalline silicon region;

forming a gate over the gate dielectric; and forming a first diffusion region and a second diffusion region in the strained crystalline silicon region, the first and second diffusion regions being separated by a channel region formed in the crystalline silicon region between the gate and the proximity gettering region.

21. The method of claim 20, wherein forming a relaxed silicon germanium gettering region includes performing an ultra high vacuum chemical vapor deposition (UHV CVD) process to epitaxially form the relaxed silicon germanium gettering region.

22. The method of claim 20, wherein forming a relaxed silicon germanium gettering region includes:

implanting germanium ions into a silicon substrate with a desired dose and energy to form a silicon region containing germanium ions beneath a silicon layer in the substrate and to at least partially amorphize the silicon layer; and heat treating the substrate to regrow a crystalline silicon layer over a resulting silicon germanium layer using a solid phase epitaxial (SPE) process.

23. The method of claim 1, further comprising implanting silicon ions with a substrate preparation doping profile before implanting germanium ions to discourage channeling when the germanium ions are implanted.

24. The method of claim 1, further comprising implanting silicon ions with an amorphizing doping profile after implanting germanium ions and before annealing, wherein:

implanting germanium ions partially amorphize a top layer of silicon in the silicon substrate;

implanting silicon ions with the amorphizing doping profile further amorphize the top layer of silicon before annealing; and annealing transforms the amorphized top layer of silicon into a crystalline silicon layer using a solid phase epitaxial (SPE) process.

25. The method of claim 1, further comprising:

implanting silicon ions with a substrate preparation doping profile before implanting germanium ions to discourage channeling when the germanium ions are implanted; and implanting silicon ions with an amorphizing doping profile after implanting germanium ions and before annealing, wherein:
   implanting germanium ions partially amorphize a top layer of silicon in the silicon substrate;
   implanting silicon ions with the amorphizing doping profile further amorphize the top layer of silicon before annealing; and
   annealing transforms the amorphized top layer of silicon into a crystalline silicon layer using a solid phase epitaxial (SPE) process.

26. The method of claim 4, further comprising:
implanting silicon ions with a substrate preparation doping profile before implanting germanium ions to discourage channeling when the germanium ions are implanted; and
implanting silicon ions with an amorphizing doping profile after implanting germanium ions and before heat treating, wherein:
   implanting germanium ions partially amorphize a top layer of silicon in the silicon substrate;
   implanting silicon ions with the amorphizing doping profile further amorphize the top layer of silicon before annealing; and
   heat treating transforms the amorphized top layer of silicon into a crystalline silicon layer using a solid phase epitaxial (SPE) process.

27. The method of claim 26, wherein performing two or more germanium ion implants includes implanting germanium ions into a silicon substrate using at least a first doping profile and a second doping profile, the first doping profile to implant germanium ions with a desired dose and energy to provide a first concentration of germanium ions at a first depth in the silicon substrate, the second doping profile to provide a second concentration of germanium ions at a second depth in the silicon substrate, wherein the first depth in the silicon substrate is lower than the second depth and the first concentration is lower than the second concentration.

* * * * *